(12) United States Patent
Jain

(10) Patent No.: US 7,791,926 B2
(45) Date of Patent: Sep. 7, 2010

(54) SEU HARDENING CIRCUIT AND METHOD

(75) Inventor: Palkesh Jain, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 466 days.

(21) Appl. No.: 11/944,434

(22) Filed: Nov. 22, 2007

(65) Prior Publication Data
US 2009/0135643 A1   May 28, 2009

(51) Int. Cl.
*G11C 11/00* (2006.01)
(52) U.S. Cl. .............. 365/154; 365/156; 365/189.09
(58) Field of Classification Search ............. 365/154, 365/156, 181, 189.08, 189.09, 190
See application file for complete search history.

(56) References Cited

U.S. PATENT DOCUMENTS

| | | | | |
|---|---|---|---|---|
| 5,999,456 A | * | 12/1999 | Sali et al. | 365/185.28 |
| 6,037,808 A | * | 3/2000 | Houston et al. | 327/55 |
| 6,061,268 A | * | 5/2000 | Kuo et al. | 365/156 |
| 6,122,191 A | * | 9/2000 | Hirose et al. | 365/185.01 |
| 7,400,525 B1 | * | 7/2008 | Kim | 365/156 |
| 2002/0112137 A1 | * | 8/2002 | Houston | 711/200 |

* cited by examiner

*Primary Examiner*—Gene N. Auduong
(74) *Attorney, Agent, or Firm*—Dawn V. Stephens; Wade James Brady, III; Frederick J. Telecky, Jr.

(57) ABSTRACT

An SEU hardening circuit and method is disclosed. In one embodiment, a method includes providing a semiconductor memory component having a pair of pMOS transistors and a pair of nMOS transistors, tying a first pMOS body terminal of a first pMOS transistor of the pair of pMOS transistors to a second pMOS gate terminal of a second pMOS transistor of the pair of pMOS transistors, and tying at least a first pre-designated body terminal of at least one transistor selected from the group including essentially of a pair of pMOS transistors and a pair of nMOS transistors to at least a second pre-designated terminal of at least one pre-designated transistor selected from the group including essentially of the pair of pMOS transistors and the pair of nMOS transistors.

19 Claims, 9 Drawing Sheets

SEU HARDENING CIRCUIT AND METHOD

FIELD OF THE INVENTION

The present invention relates generally to semiconductor devices and more particularly relates to a soft error upset (SEU) hardening memory circuit and method.

BACKGROUND

A high-energy particle strike to a sensitive node in a microelectronic device may result in an error in the device output or operation. The error, sometimes referred to as a soft error or a single event upset (SEU) may be, for example, a change of logic state in the circuit.

Attempts to minimize effects of the particle strike or to avoid an SEU generally fall into categories of SEU avoidance, SEU masking, and SEU management. SEU avoidance techniques may focus on reduction on the severity of the environment; reduction in charge generation and/or collection; and elimination or reduction in circuit response to collected charge. Such efforts, however, may significantly decrease the circuit's native performance. Other considerations may include high area and power overheads. Further, it may be difficult to reuse a design for low power applications that do not have a need for redundancy.

SEU masking techniques may focus on informational redundancy, including error detection and correction coding, and spatial and temporal redundancy. Such efforts, however, may result in increased area or delay overhead.

SEU management techniques may focus on fault detection, fault containment, and system recovery. Such efforts, however, may result in inserting redundant elements and significant area and delay overhead.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

An SEU hardening circuit and method is disclosed. In the following description, for purposes of explanation, numerous specific details are set forth in order to provide a thorough understanding of the various embodiments. It will be evident, however, to one skilled in the art that the various embodiments may be practiced without these specific details.

Figure 1:
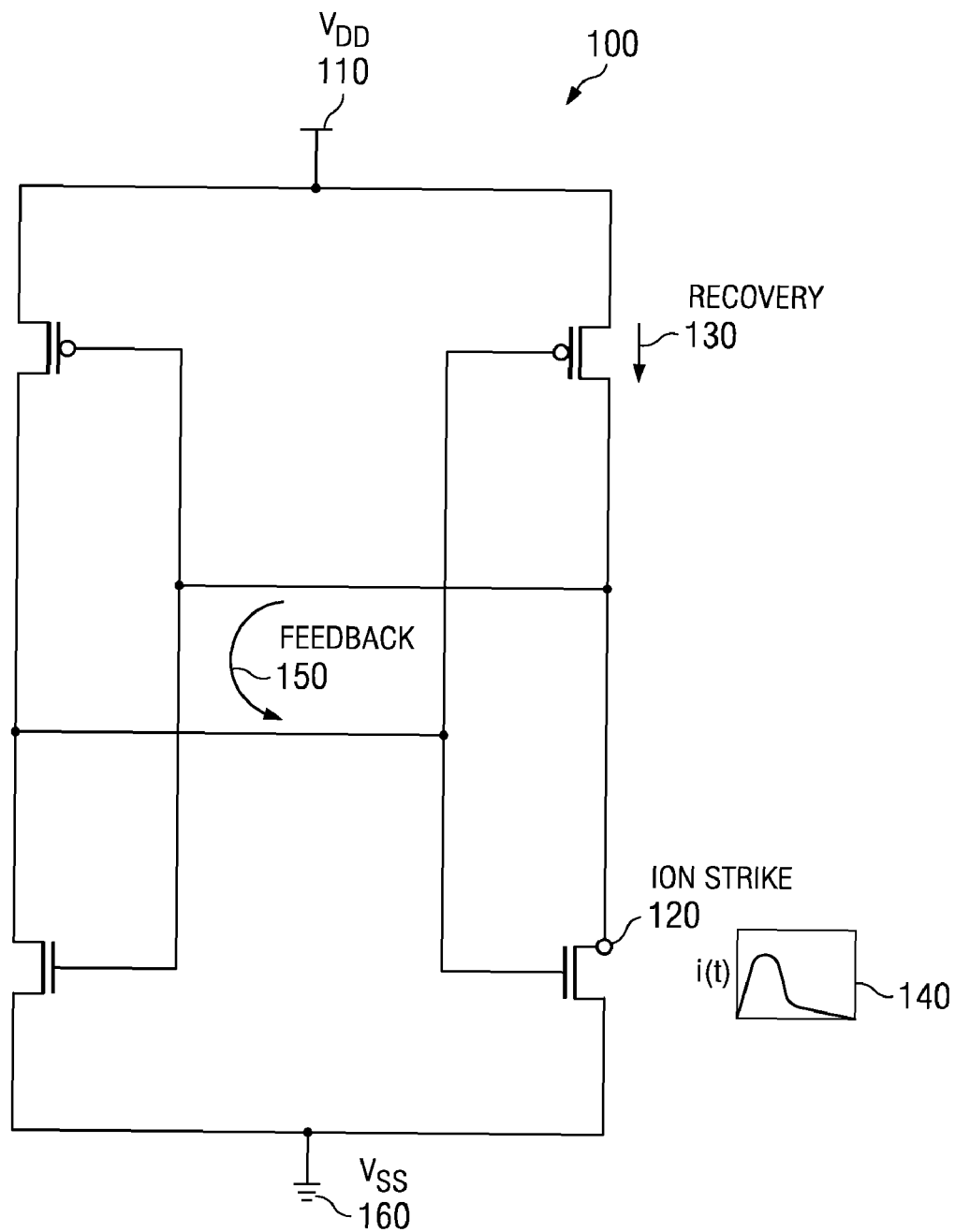
FIG. 1 is a schematic circuit diagram illustrating a soft error upset (SEU) event in a typical Static Random Access Memory (SRAM) cell, according to prior art.

FIG. 1 is a schematic circuit diagram 100 illustrating a soft error upset (SEU) event in a typical Static Random Access Memory (SRAM) cell, according to prior art. Particularly, FIG. 1 illustrates the SRAM cell 100 having a pair of pMOS transistors and a pair of nMOS transistors that form two cross-coupled inverter pair. A first inverter (serially coupled first pMOS transistor and first nMOS transistor) and a second inverter (serially coupled second pMOS transistor and second nMOS transistor) are connected between $V_{dd}$ terminal 110 and $V_{ss}$ terminal 160.

FIG. 1 illustrates an ion strike 120 at a sensitive location of the first nMOS transistor (e.g., "OFF" n-channel transistor). When an energy particle strikes a sensitive location of the first nMOS transistor, sometimes referred to as a "struck transistor", charge collected by the junction may result in a transient current in the struck transistor. As this current flows through the struck transistor, the first pMOS transistor ("ON" p-channel transistor, sometimes referred to as a "restoring transistor", sources current in an attempt to balance the particle-induced current (i.e., transient current).

As the restoring transistor has a finite amount of current drive, and equally importantly, a finite channel conductance, current flow through the restoring transistor induces a voltage drop at its drain. This voltage transient in response to the single-event current transient is actually the mechanism that can cause an SEU in the SRAM cell 100. For example, the voltage transient may be essentially similar to a write pulse and can cause wrong memory state to be locked into the SRAM cell 100. In the typical SRAM cells 100, recovery 130 is slow and feedback 150 is fast when the ion strike 120 occurs at the sensitive point. A curve 140 illustrates a magnitude of transient current flowing (e.g., which may result in an SEU) through the struck transistor with respect to time when the energy particle strikes at the sensitive point of the SRAM cell 100. In the SRAM cell 100 illustrated in FIG. 1, the ion strike 120 can occur at any of the four sensitive locations i.e., the four transistor drains interior to the SRAM cell 100.

To ensure higher SER reliability in the SRAM cell 100, a technique for designing SEU tolerant memories (e.g., the SRAM cell 100 with an ADTMOS configuration illustrated in FIG. 5A) by first principle of tolerance, without inserting redundant elements and without significant area/delay overhead is implemented in various embodiments of the present invention. Further, the SEU hardening technique can be implemented by increasing recovery strength of the pMOS transistor(s) and reducing feedback from the inverter during the ion strike 120 through dynamically adjusting threshold of transistors in the SRAM cell 100. This results in increase in value of charge (Qcrit) necessary to result in an SEU. Thus the possibility of occurrence of an SEU when the particle strikes the sensitive point in the SRAM cell 100 is reduced (as SER depends exponentially to Qcrit). In some embodiments, the threshold of the transistors is adjusted dynamically based on content logic.

Figure 2A:
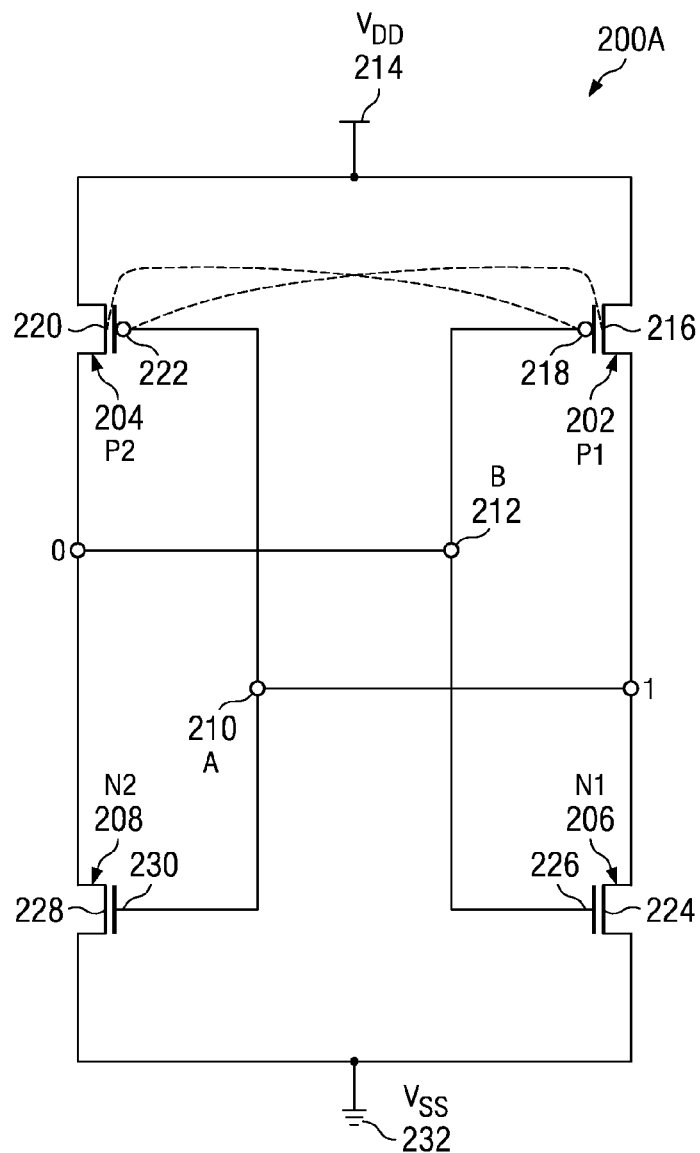
FIG. 2A is a schematic circuit diagram illustrating a SRAM cell with a Reverse Dynamic Threshold Metal Oxide Semiconductor (RDTMOS) cell structure, according to one embodiment.

FIG. 2A is a schematic circuit diagram 200A illustrating a SRAM cell with a Reverse Dynamic Threshold Metal Oxide Semiconductor (RDTMOS) cell structure, according to one embodiment. Particularly, FIG. 2A illustrates a semiconductor memory component having a pair of pMOS transistors P1 202 and P2 204 and a pair of nMOS transistors N1 206 and N2 208 configured to form the RDTMOS cell structure of the SRAM cell 200A. The SRAM cell 200A illustrated in FIG. 2A includes the pMOS transistor P1 202 connected in series with the nMOS transistor N1 206. Similarly, the pMOS transistor P2 204 is connected in series with the nMOS transistor N2 208.

The series connected pMOS transistor P1 202 and nMOS transistor N1 206 are connected between the power supply lines $V_{dd}$ 214 and $V_{ss}$ 232. Also, the series connected pMOS transistor P2 204 and nMOS transistor N2 208 are connected between the power supply lines $V_{dd}$ 214 and $V_{ss}$ 232. For example, the $V_{dd}$ terminal 214 represents a low positive direct current voltage and the $V_{ss}$ terminal 232 represents a reference potential such as ground.

The schematic representation shown in FIG. 2A includes a node point B 212 between the series-connected transistors P1 202 and N1 206 and a second node point A 210 between the series-connected transistors P2 204 and N2 208. Further, a pMOS gate terminal 218 and an nMOS gate terminal 226 are electrically connected to the node point B 212. Similarly, the pMOS gate terminal 222 and the nMOS gate terminal 230 are electrically connected to the node point A 210.

In the example embodiment illustrated in FIG. 2A, the nMOS transistors N1 206 and N2 208 are of standard configuration. In some embodiments, a first pMOS body terminal 216 of the first pMOS transistor P1 202 is tied to the second pMOS gate terminal 222 of the second pMOS transistor P2 204. In these embodiments, a second pMOS body terminal 220 of the second pMOS transistor P2 204 is tied to the first pMOS gate terminal 218 of the first pMOS transistor P1 202.

In one embodiment, the RDTMOS transistor includes the pair of pMOS transistors including the first pMOS transistor P1 202 containing the first pMOS body terminal 216, and the first pMOS gate terminal 218 and the second pMOS transistor P2 204 having the second pMOS body terminal 220 tied to the first pMOS gate terminal 218 of the first pMOS transistor P1 202, and the second pMOS gate terminal 222 tied to the first pMOS body terminal 216 of the first pMOS transistor P1 202, and a pair of nMOS transistors including a first nMOS transistor N1 206 having a first nMOS body terminal 224, and the first nMOS gate terminal 226, and a second nMOS transistor N2 208 having a second nMOS body terminal 228, and the second nMOS gate terminal 230. In some embodiments, the RDTMOS transistor is ported using bulk CMOS technology. In addition, the RDTMOS configuration is compatible with CMOS flow.

Figure 2B:
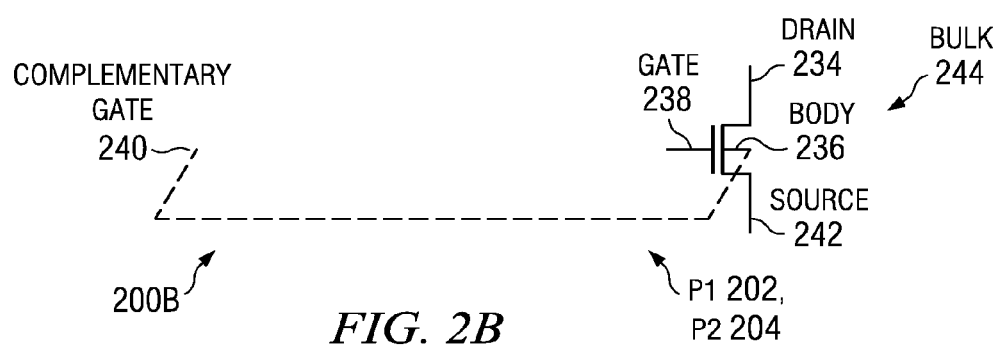
FIG. 2B is a schematic circuit symbol representing the RDTMOS configuration of the SRAM cell, according to one embodiment.

FIG. 2B is a schematic circuit symbol 200B representing a RDTMOS configuration of the SRAM cell 200A, according to one embodiment. Particularly, a drain terminal 234, a body terminal 236, a gate terminal 238, a complementary gate terminal 240, a source terminal 242 and bulk 244 of the pMOS transistor (P1 202, P2 204) are illustrated in FIG. 2B.

The symbolic representation 200B illustrates the RDTMOS configuration for a pMOS transistor (i.e., P1 202, P2 204) in which the body terminal 236 of one pMOS transistor is tied to a complementary gate terminal 240 of other pMOS transistor. The drain terminal 234 is connected to the $V_{dd}$ terminal 214 (as shown in FIG. 2A). For example, the complementary gate terminal 240 is a gate terminal of any one of the pMOS transistors P1 202 and P2 204 connected to the body terminal 236 of other pMOS transistor.

Figure 3A:
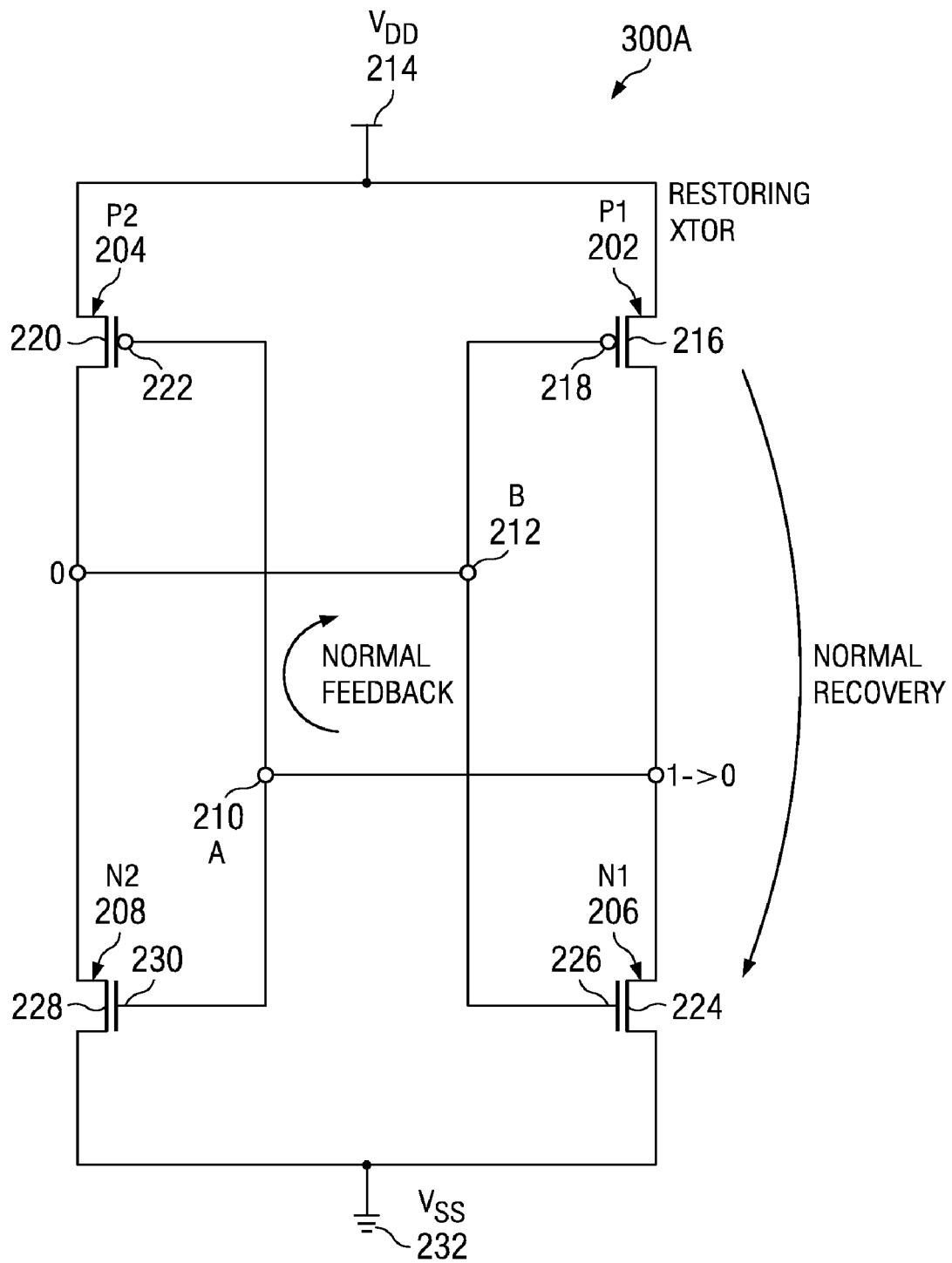
FIG. 3A is a schematic circuit diagram illustrating a SRAM cell having a conventional cell structure, according to prior art.

FIG. 3A is a schematic circuit diagram 300A illustrating a SRAM cell having a conventional cell structure, according to prior art. The conventional SRAM cell 300A illustrated in FIG. 3A includes a pair of pMOS transistors P1 202 and P2 204 connected to the $V_{dd}$ terminal 214 and a pair of nMOS transistors N1 206 and N2 208 connected to $V_{ss}$ terminal 232.

In the conventional SRAM cell 300A, if the body terminal of the pMOS transistor P1 202 and the body terminal of the pMOS transistor P2 204 are tied to the pre-designated terminal $V_{dd}$ 214, and the body terminal 224 of the nMOS transistor N1 206 and the body terminal 228 of the nMOS transistor N2 208 are tied to the pre-designated terminal $V_{ss}$ 232, then a particle strike of charge 27.3 fC may result in SEU. Also, in case of the conventional SRAM cells feedback is faster than the recovery during the particle strike.

Figure 3B:
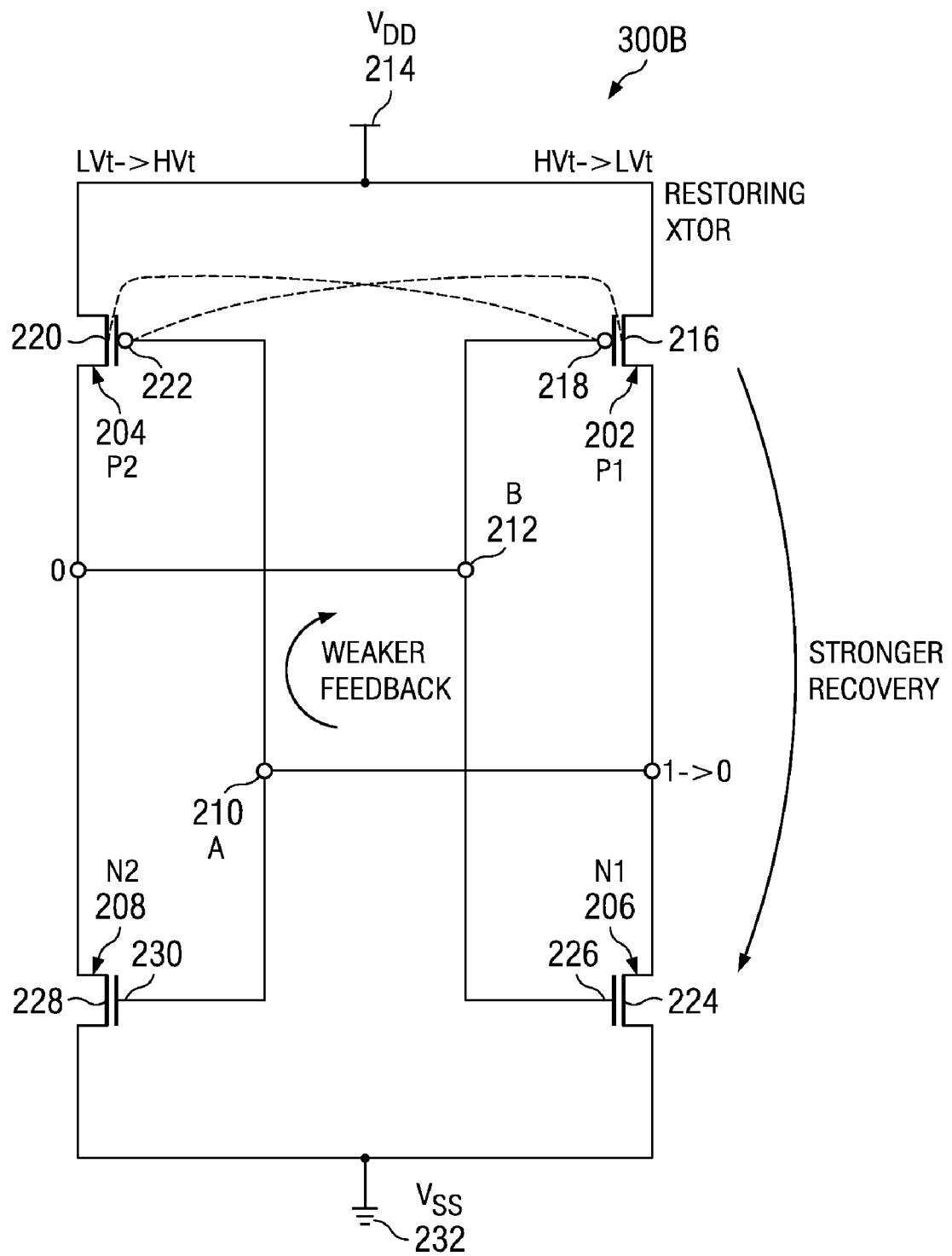
FIG. 3B is a schematic circuit diagram illustrating the SRAM cell having the RDTMOS configuration, according to one embodiment.

FIG. 3B illustrates a schematic circuit diagram 300B illustrating a SRAM cell having the pMOS only RDTMOS cell structure, according to one embodiment. Particularly FIG. 3B illustrates the RDTMOS cell structure 300B similar to what illustrated in FIG. 2A.

In the pMOS only RDTMOS cell structure 300B, recovery is faster and feedback is slower. In some embodiments, the response is strengthened and the feedback is weakened due to dynamic change in the drives of P1 202 and P2 204 xtors respectively. In these embodiments, threshold(s) of the pMOS transistors are adjusted dynamically based on content logic to increase the recovery strength of the pMOS transistors (i.e., P1 202 and P2 204) and reduce the feedback from the opposite inverter (i.e., N1 206 and N2 208) during the particle strike. As a result, the recovery occurs faster than the feedback. In the RDTMOS SRAM cell 300B, a minimum particle strike charge of 43.81 fC may result in SEU when the energy particle strikes at a sensitive point of the SRAM cell 300B.

It can be seen that the difference between Qcrit of the RDTMOS SRAM cell 300B with the conventional SRAM cell 300A is 16.51 fC, i.e., it is possible to improve the Qcrit for the pMOS only RDTMOS SRAM cell 300B by, for example 60%. One skilled in the art will recognize that the range of improvement may vary as compare with this particular example. Thus, the pMOS only RDTMOS SRAM cells are more tolerant than other conventional SRAM cells.

Figure 4:
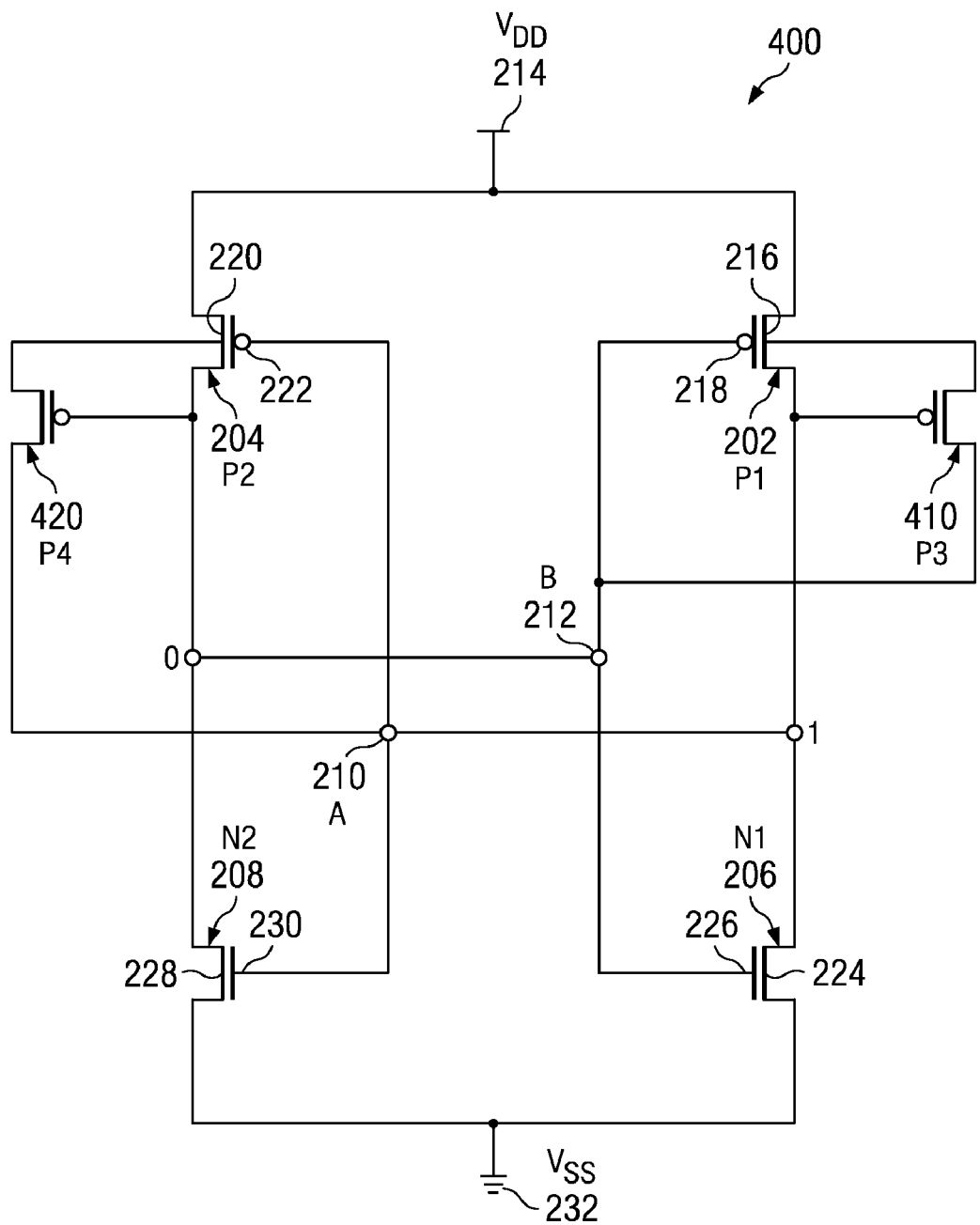
FIG. 4 is a schematic circuit diagram illustrating a dynamic derivative of the pMOS only RDTMOS configuration of the SRAM cell, according to one embodiment.

FIG. 4 is a schematic circuit diagram 400 illustrating a dynamic derivative of the pMOS only RDTMOS configuration of the SRAM cell, according to one embodiment. The dynamic derivative of the RDTMOS configuration of the SRAM cell 400 includes pMOS transistors P3 410 and P4 420 tied to the pMOS transistors P1 202 and P2 204 respectively. In some embodiments, a drain, gate, and source terminals of the pMOS transistor P3 410 are tied to a body, source terminals of the pMOS transistor P1 202 and a node point B 212 respectively. Similarly, a drain, gate, and source terminals of the pMOS transistor P4 420 are tied to a body, source terminals of the pMOS transistor P2 204 and a node point A 210 respectively.

For example, consider the node A 210 to be at logic 1. Under such a condition, the pMOS transistor P1 202 recognizes no body bias and the transistor P2 204 sees a native body connection. Thus, when the node A 210 is storing logic 1, the dynamic circuit 400 has no leakage concerns. Further, consider that the ion strikes on the node A 210 (which is at logic 1), then the pMOS transistor P3 410 gets charged up and connects the body terminal 216 of the pMOS transistor P1 202 to the node B 212 (which is at logic 0). As a result, drive in the pMOS transistor P1 202 increases whereas drive in the pMOS transistor P2 204 remains nominal.

In some embodiments, as threshold voltage changes only in active operation of the SRAM cell 400, the dynamic circuit 400 addresses leakage issues. In these embodiments, the threshold voltage drop provided by any of the transistors P3 410 and P4 420 results in an increase in power supply operating regime. It can be noted that, a minimum charge (Qcrit) of 39.4 fC will result in an SEU in the truly dynamic circuit 400.

Figure 5A:
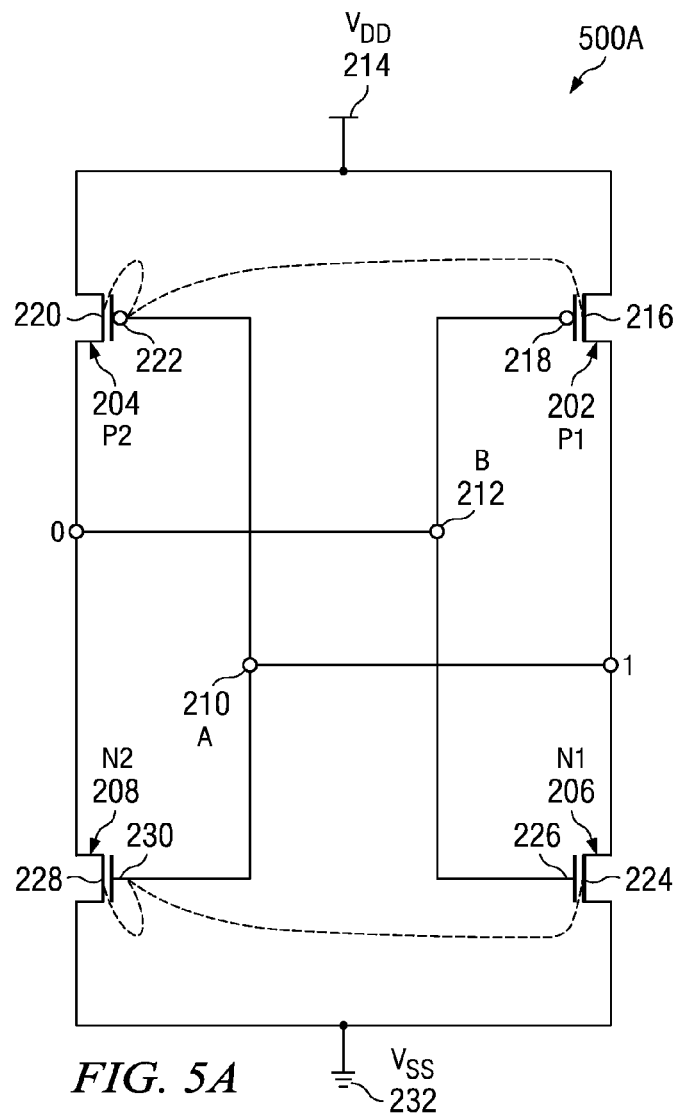
FIG. 5A is a schematic circuit diagram illustrating a SRAM cell with an Asymmetric Dynamic Threshold Metal Oxide Semiconductor (ADTMOS) cell structure, according to another embodiment.

FIG. 5A is a schematic circuit diagram 500A illustrating a SRAM cell with an Asymmetric Dynamic Threshold Metal Oxide Semiconductor (ADTMOS) cell structure, according to one embodiment. Particularly, FIG. 5A illustrates a semiconductor memory component having a pair of pMOS transistors P1 202 and P2 204 and a pair of nMOS transistors N1 206 and N2 208 configured to form the ADTMOS cell structure of the SRAM cell 500A. The schematic circuit diagram 500A is similar to that explained in FIG. 2A, except that FIG. 5A illustrates the ADTMOS configuration of the SRAM cell 500A.

In the example embodiment illustrated in FIG. 5A, a first pMOS body terminal 216 of the first pMOS transistor P1 202 is tied to a second pMOS gate terminal 222 of the second pMOS transistor P2 204. A second pMOS body terminal 220 of the second pMOS transistor P2 204 is tied to the second pMOS gate terminal 222 of the second pMOS transistor P2 204.

In some embodiments, a first nMOS body terminal 224 of the first nMOS transistor N1 206 is tied to a second nMOS gate terminal 230 of the second nMOS transistor N2 208. A second nMOS body terminal 228 of the second nMOS transistor N2 208 is tied to the second nMOS gate terminal 230 of the second nMOS transistor N2 208.

For example, the ADTMOS transistor 500A includes the pair of pMOS transistors including the first pMOS transistor P1 202 having the first pMOS body terminal 216, and the first pMOS gate terminal 218, and the second pMOS transistor P2 204 having the second pMOS body terminal 220, and the second pMOS gate terminal 222 tied to the first pMOS body terminal 216 of the first pMOS transistor P1 202 and the second pMOS body terminal 220 of the second pMOS transistor P2 204, and the pair of nMOS transistors including the first nMOS transistor N1 206 having the first nMOS body terminal 224, and the first nMOS gate terminal 226, and the second nMOS transistor N2 208 having the second nMOS body terminal 228 tied to the second nMOS gate terminal 230 of the second nMOS transistor N2 208, and the second nMOS gate terminal 230 tied to the first nMOS body terminal 224 of the first nMOS transistor N1 206. In one embodiment, the ADTMOS transistor 500A is ported using deep nWell technology. In another embodiment, the ADTMOS transistor 500A can be ported using SOI technology. Further, it can be noted that the ADTMOS configuration 500A, for example, may be one of the most tolerant of all 256 possible configurations, thus ensuring higher SER reliability.

Figure 5B:
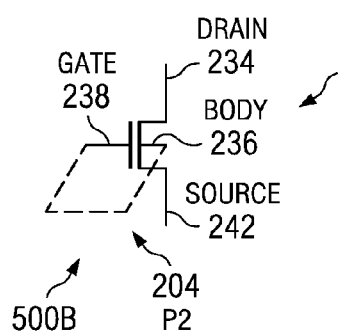
FIG. 5B is a schematic circuit symbol representing the ADTMOS configuration for the first pMOS transistor of FIG. 5A, according to another embodiment.
Figure 5C:
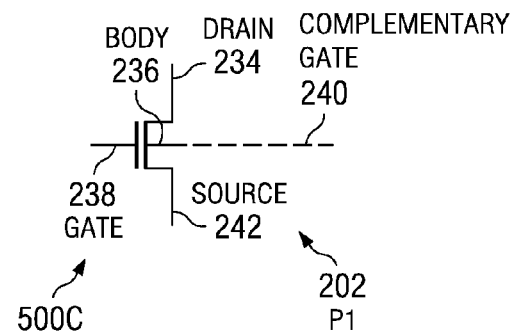
FIG. 5C is a schematic circuit symbol representing the ADTMOS configuration for the second pMOS transistor of FIG. 5A, according to another embodiment.

FIG. 5B is a schematic circuit symbol 500B representing the ADTMOS configuration 500A for the pMOS transistor P2 204 of FIG. 5A, according to one embodiment. Particularly, the drain terminal 234, the body terminal 236, the gate terminal 238, the source terminal 242 and the bulk 244 of the pMOS transistor P2 204 are illustrated in FIG. 5C. The symbolic representation 500B illustrates the ADTMOS configuration 500A for the pMOS transistor P2 204 in which the body terminal 236 of the pMOS transistor P2 204 is tied to the complementary gate terminal 240 of the pMOS transistor P2 204.

FIG. 5C is a schematic circuit symbol 500C representing the ADTMOS configuration 500A for the pMOS transistor P1 202 of FIG. 5A, according to one embodiment. Particularly, the drain terminal 234, the body terminal 236, the gate terminal 238, the complementary gate terminal 240 and the source terminal 242 of the pMOS transistor P1 202 are illustrated in FIG. 5C. The symbolic representation 500C illustrates the ADTMOS configuration 500A for the pMOS transistor P1 202 in which the body terminal 236 of the pMOS transistor P1 202 is tied to the complementary gate terminal 240 of the pMOS transistor P2 204. The drain terminal 234 is connected to the $V_{dd}$ terminal 214.

For example, the complementary gate terminal 240 represents a terminal to which a gate terminal of P2 204 is connected to body terminal 236 of other pMOS transistor (i.e., P1 202) to configure the SRAM cell 500A with the ADTMOS cell structure.

Figure 6:
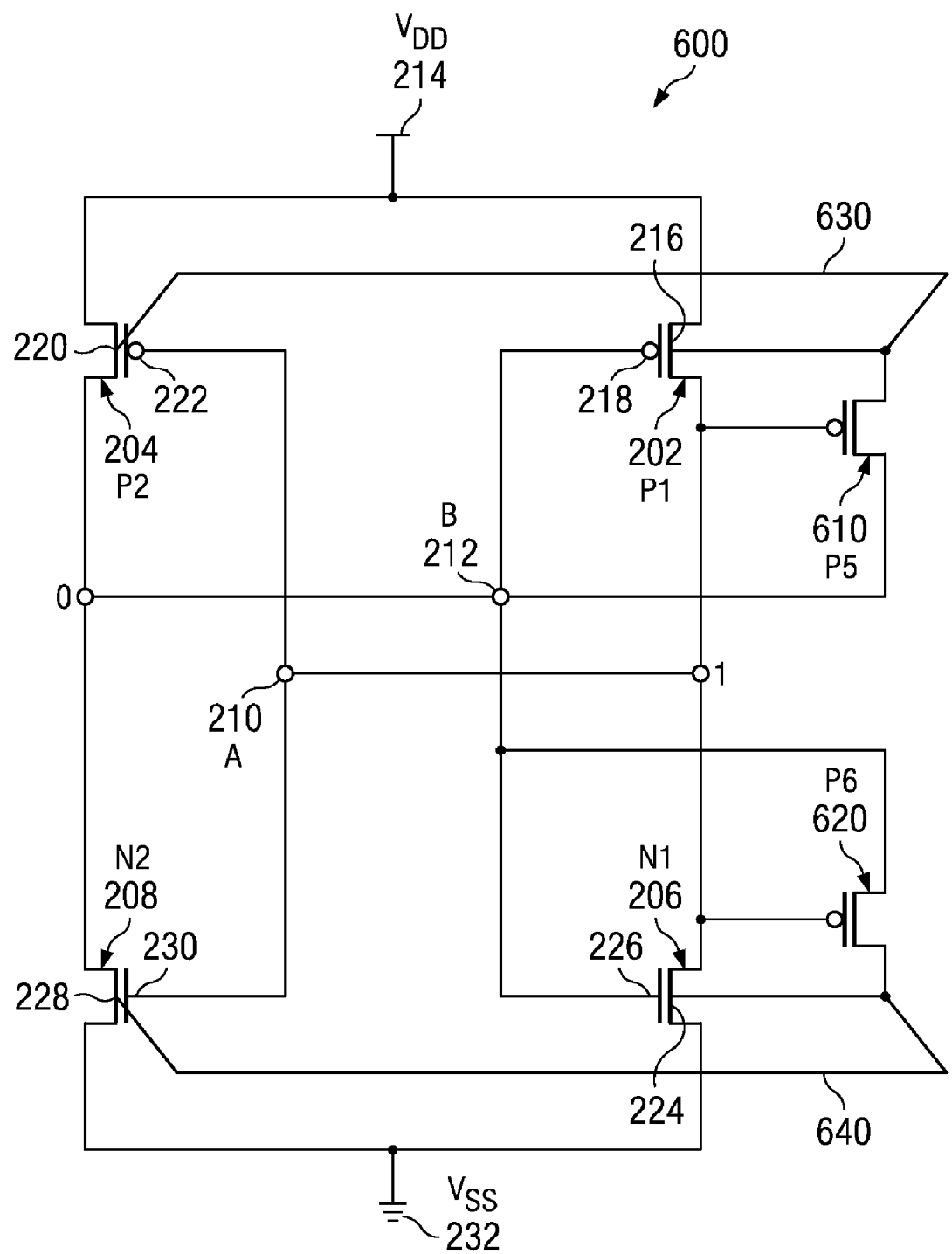
FIG. 6 is a schematic circuit diagram illustrating a dynamic derivative of the ADTMOS configuration of the SRAM cell, according to another embodiment.

FIG. 6 is a schematic circuit diagram 600 illustrating a dynamic derivative of an ADTMOS configuration of the SRAM cell, according to one embodiment. The dynamic derivative of the ADTMOS configuration of the SRAM cell 600 includes pMOS transistors P5 610 and P6 620 tied to the pMOS transistors P1 202 and the nMOS transistor N1 206 respectively. In some embodiments, a drain, gate, and source terminals of the pMOS transistor P5 610 are tied to body and source terminals of the pMOS transistor P1 202 and the node point B 212 respectively. Also, the drain terminal 630 of P5 610 is tied to the body terminal 220 of the pMOS transistor P2 204. Similarly, a gate and source terminals of the pMOS transistor P6 620 are tied to drain and body terminals of the nMOS transistor N1 206 respectively. In addition, the source terminal 640 of P6 620 is tied to the body terminal 226 of N2 208. Further, the drain of P6 620 is tied to a common junction (i.e., connecting the gate terminals of P1 202 and N1 206).

For example, consider the node A 210 to be at logic 1. Under such a condition, the pMOS transistors P1 202 and P2 204 recognizes no body bias and the nMOS transistors N1 206 and N2 208 recognizes a native body connection. Thus, when the node A 210 is storing logic 1, the dynamic circuit 600 has no leakage concerns.

Further, consider energy particle strike on the node A 210 (which is at logic 1), during which the pMOS transistor P5 610 is turned "ON". This leads to increase in drive of the pMOS transistor P1 202. Further, this may result in initial increase in drive of the nMOS transistor N1 206 thus sustaining more current. Subsequently, the threshold voltage returns to a native state thereby delaying "Turn-ON" state of the nMOS transistor N1 206. In some embodiments, lower threshold voltage for the nMOS transistor N2 208 facilitates the nMOS transistor N2 208 to remain in "Turn-ON" state for longer duration. The dynamic circuit 600 addresses leakage issues as change in threshold voltage takes place in active operation of the SRAM cell 600. It can be noted that a minimum charge (Qcrit) of 48.76 fC is necessary to cause an SEU in the truly dynamic circuit 600.

Figure 7:
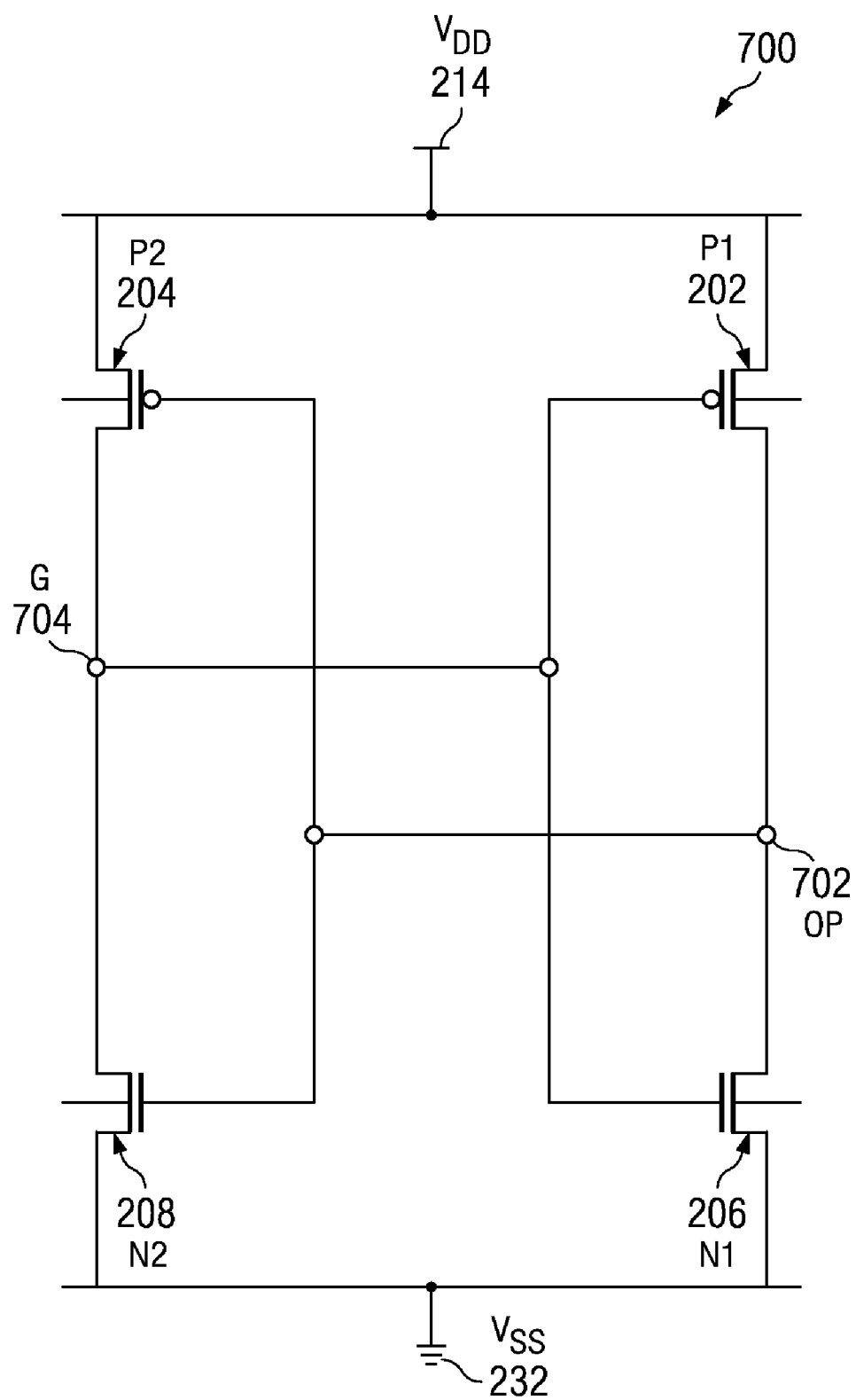
FIG. 7 is a schematic circuit diagram illustrating a typical SRAM cell having a pair of pMOS transistors (P1, P2) and a pair of nMOS transistors (N1, N2), according to one embodiment.

FIG. 7 is a schematic circuit diagram 700 illustrating a typical semiconductor memory cell having a pair of pMOS transistors (P1 202, P2 204) and a pair of nMOS transistors (N1 206, N2 208), according to one embodiment. The series connected pMOS transistor P1 202 and the nMOS transistor N1 206 and the series connected pMOS transistor P2 204 and nMOS transistor N2 208 are connected between a bias voltage $V_{dd}$ 214 and a ground voltage $V_{ss}$ 232 (i.e. at 0 volts) respectively. A gate terminal of the pMOS transistor P1 202 is connected to a gate terminal of the nMOS transistor N1 206 and a gate terminal of the pMOS transistor P2 204 is connected to a gate terminal of the nMOS transistor N2 208.

Further, FIG. 7 illustrates a node point OP 702 between the series connected transistors P1 202 and N1 206 and a second node point G 704 between the series connected transistors P2 204 and N2 208. In some embodiments, the transistor P1 202 is "ON" when the transistor N1 206 is "OFF" as the gate terminals of P1 202 and N1 206 are connected to the same input G 704. Similarly, the transistor P2 204 is "ON" when the transistor N2 208 is "OFF" as the gate terminals of P2 204 and N2 208 are connected to the same input OP 702. In these embodiments, the node point G 704 stores logic 0 and the node point OP 704 stores logic 1.

In some embodiments, an associated critical charge (Qcrit) for different SRAM configurations is obtained when each of the body terminals P1 202, P2 204, N1 206 and N2 208 is connected to any one of pre-designated terminals i.e., $V_{dd}$ 214, $V_{ss}$ 232, OP 702 and G 704. In these embodiments, each body terminal i.e., P1 202, P2 204, N1 206 and N2 208 can connect to four nodes namely, $V_{dd}$ 214, $V_{ss}$ 232, OP 702 and G 704 to yield different values of critical charge (Qcrit). The critical charge is a minimum charge of a particle necessary to result in an SEU in the associated terminal configuration.

The following Table 1 entitled, "Reliability Analysis of Various Dynamic Threshold SRAMS" may provide sample analysis information of the total possible SRAM configurations (i.e. 256 configurations). The Table 1 includes possible terminal configurations for the body terminals of the pMOS transistor P1 202, the pMOS transistor P2 204, the nMOS transistor N1 206, and the nMOS transistor N2 208 of the SRAM cell 700 illustrated in FIG. 7. In addition, the Table 1 lists an associated critical charge (Qcrit) for each terminal configuration.

The convention terminal configurations and associated critical charge are shown in row 3 of the following Table 1. By contrast, the terminal configurations for the DMTOS and the ADTMOS list possible terminal configurations for a particular body terminal of the SRAM cell 700 (FIG. 7) tied to a pre-designated terminal, e.g., $V_{dd}$ 214, OP 702, G 704, and $V_{ss}$ 232 (of FIG. 7), are set out in row 11 and row 16 of the following Table 1 respectively.

TABLE 1

"Reliability Analysis of Various Dynamic Threshold SRAMS"

| pMOS transistor P1 Body | pMOS transistor P2 Body | nMOS transistor N1 Body | nMOS transistor N2 Body | Critical Charge (fC) | Type |
|---|---|---|---|---|---|
| VDD | 0 | 0 | 0 | 26.82 | |
| VDD | 0 | VDD | 0 | 27.21 | |
| VDD | VDD | 0 | 0 | 27.30 | Conventional |
| VDD | 0 | 0 | VDD | 27.41 | |
| 0 | G | OP | VDD | 35.57 | |
| G | VDD | OP | 0 | 35.57 | |

TABLE 1-continued

"Reliability Analysis of Various Dynamic Threshold SRAMS"

| pMOS transistor P1 Body | pMOS transistor P2 Body | nMOS transistor N1 Body | nMOS transistor N2 Body | Critical Charge (fC) | Type |
|---|---|---|---|---|---|
| G | G | G | G | 35.57 | ADTMOS-II |
| OP | 0 | 0 | 0 | 35.65 | |
| OP | OP | VDD | VDD | 45.20 | |
| G | OP | OP | G | 45.31 | |
| G | OP | G | OP | 45.37 | DTMOS |
| OP | VDD | OP | OP | 45.50 | |
| OP | OP | VDD | OP | 48.37 | |
| OP | OP | G | OP | 50.16 | |
| OP | OP | OP | G | 50.78 | |
| OP | OP | OP | OP | 51.58 | ADTMOS |

For example, and with reference to the Table 1, as shown in row 3 of table 1, in the conventional SRAM cell 300A, if the body terminal of the pMOS transistor P2 204 and the body terminal of the pMOS transistor P1 202 are tied to the pre-designated terminal $V_{dd}$ 214 (i.e., which is at logic 1), and the body terminal of the nMOS transistor N1 206 and the body terminal of the nMOS transistor N2 208 are tied to the pre-designated terminal $V_{ss}$ 232 (i.e., which is at logic 0), then a particle strike of charge 27.3 fC may result in an SEU.

By contrast, as shown in row 16 of the Table 1, in the ADTMOS SRAM cell having the body terminals of the pMOS transistor P2 204, the pMOS transistor P1 202, the nMOS transistor N1 206 and the nMOS transistor N2 208 tied to the pre-designated terminal OP 702 (i.e. a node storing logic 1), the particle must have a minimum charge of 51.58 fC to result in an SEU. Thus, it can be noted that the difference in Qcrit between the ADTMOS SRAM cell with the conventional SRAM cell 300A is 24.28 fC. Thus it can be envisioned that, the ADTMOS SRAM cell is most tolerant of all the 256 possible configurations.

Furthermore, it is noted that the terminal bodies of the SRAM cell 700 may also be tied to another terminal body of the SRAM cell 700, thus making the terminal bodies themselves pre-designated terminals. In this scenario, 4096 configurations of the SRAM cell 700 are possible.

Figure 8:
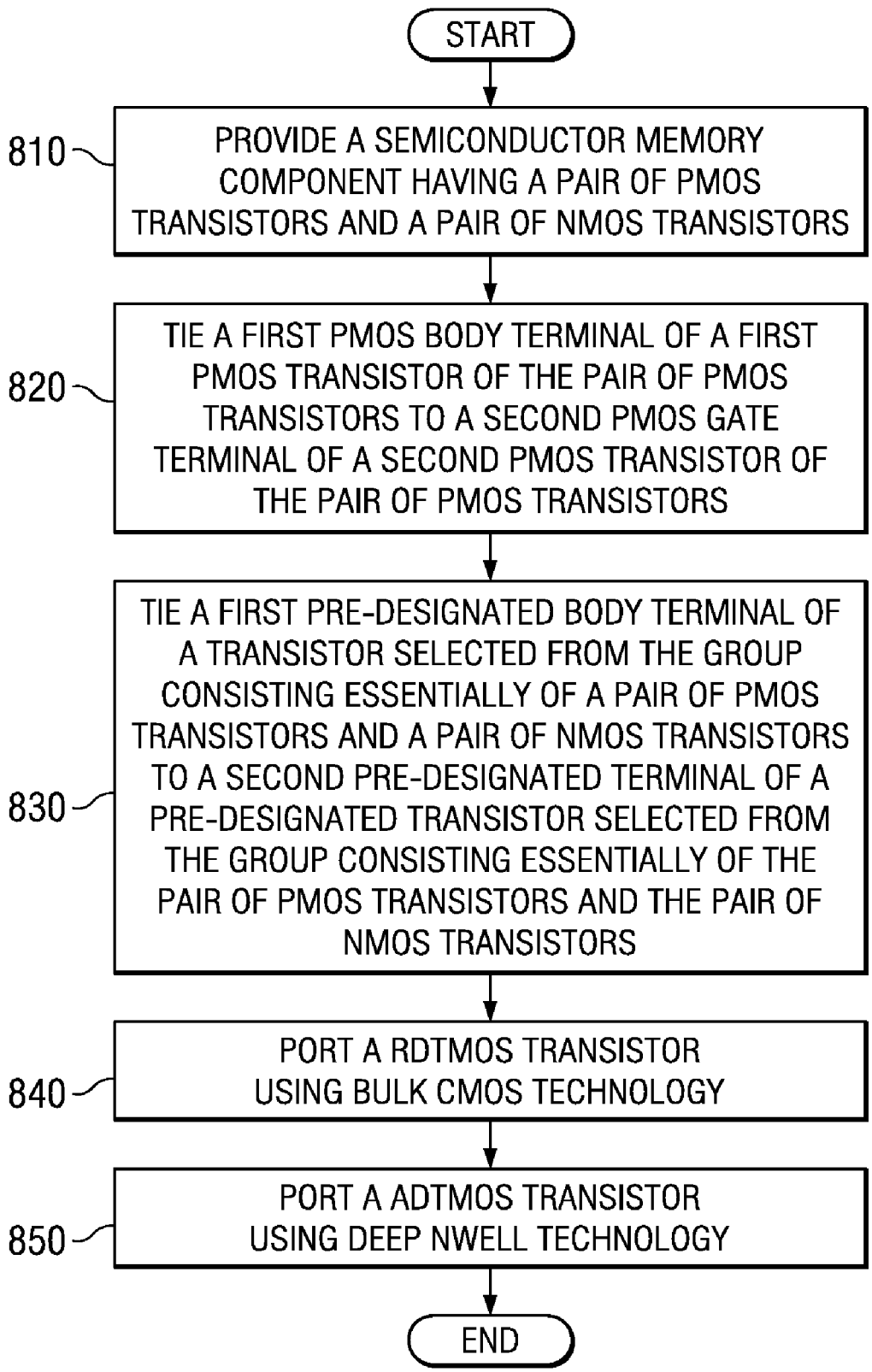
FIG. 8 is a process flow of configuring the SRAM cell having a pair of pMOS transistors (P1, P2) and a pair of nMOS transistors (N1 and N2), according to one embodiment.

FIG. 8 is a process flow of configuring the SRAM cell having a pair of pMOS transistors (P1 202 and P2 204) and a pair of nMOS transistors (N1 206 and N2 208), according to one embodiment. In operation 810, a semiconductor memory component having the pair of pMOS transistors P1 202 and P2 204 and the pair of nMOS transistors N1 206 and N2 208 is provided. In operation 820, a first pMOS body terminal (e.g., the body terminal 216 of FIG. 2A) of a first pMOS transistor P1 202 is tied to a second gate terminal (e.g., the gate terminal 222 of FIG. 2A) of a second pMOS transistor P2 204.

In operation 830, a first pre-designated body terminal of a transistor selected from a group including essentially of a pair of pMOS transistors P1 202 and P2 204 and a pair of nMOS transistors N1 206 and N2 208 and a second pre-designated terminal of a pre-designated transistor from a group including essentially of the pair of pMOS transistors P1 202 and P2 204 and the pair of nMOS transistors N1 206 and N2 208 are tied. In operation 840, a RDTMOS transistor 200A is ported using bulk CMOS technology. In operation 850, an ADTMOS transistor 500A is ported using deep nWell technology.

The above-described technique is based on dynamic threshold adjustments. The above-described technique has a minimal impact on circuit leakage as threshold voltage change takes place only in active region. Further, the above described technique can be used along with HVT xtors. In some embodiments, the leakage and reliability can be addressed through dynamically reducing the threshold of HVT.

The ADTMOS configuration of the SRAM cell 500A described above is a combination of Dynamic Threshold Metal Oxide Semiconductor (DTMOS) and RDTMOS inverters. In some embodiments, the ADTMOS configuration 500A utilizes the advantages of the DTMOS and the RDTMOS configurations of the SRAM cell to achieve higher SER reliability. In addition, in various aspects of the invention, the ADTMOS configuration 500A is compatible with multiple gate transistors and SOI/FinFETs flow.

Further, the above-described circuit may offer lesser overhead in non-dynamic configurations. In the above-described technique, read time is not substantially altered. Also, in some aspects, due to the increase in drive of the pMOS transistor (e.g., P1 202 of FIG. 4), SER reliability may trade off with write time of the SRAM cell.

The above-described method may be in a form of a machine-readable medium embodying a set of instructions that, when executed by a machine, causes the machine to perform any method disclosed herein. It will be appreciated that the various embodiments discussed herein may not be the same embodiment, and may be grouped into various other embodiments not explicitly disclosed herein.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method comprising:
    providing a semiconductor memory component having a pair of pMOS transistors and a pair of nMOS transistors;
    tying a first pMOS body terminal of a first pMOS transistor of the pair of pMOS transistors to a second pMOS gate terminal of a second pMOS transistor of the pair of pMOS transistors; and
    tying at least a first pre-designated body terminal of at least one transistor selected from the group consisting essentially of a pair of pMOS transistors and a pair of nMOS transistors to at least a second pre-designated terminal of at least one a pre-designated transistor selected from the group consisting essentially of the pair of pMOS transistors and the pair of nMOS transistors.

2. The method of claim 1, wherein the semiconductor memory component comprises an RDTMOS transistor.

3. The method of claim 2, wherein the tying at least a first pre-designated body terminal of at least one transistor selected from the group consisting essentially of a pair of pMOS transistors and a pair of nMOS transistors to at least a second pre-designated terminal of at least one pre-designated transistor selected from the group consisting essentially of the pair of pMOS transistors and the pair of nMOS transistors comprises:
    tying a second pMOS body terminal of the second pMOS transistor of the pair of pMOS transistors to a first pMOS gate terminal of the first pMOS transistor of the pair of pMOS transistors.

4. The method of claim 3, wherein the tying at least a first pre-designated body terminal of at least one transistor selected from the group consisting essentially of a pair of pMOS transistors and a pair of nMOS transistors to at least a second pre-designated terminal of at least one a pre-designated transistor selected from the group consisting essentially of the pair of pMOS transistors and the pair of nMOS transistors further comprises:
    tying a first nMOS body terminal of a first nMOS transistor of the pair of nMOS transistors to a second nMOS gate terminal of a second nMOS transistor of the pair of nMOS transistors; and
    tying a second nMOS body terminal of the second nMOS transistor of the pair of nMOS transistors to a first nMOS gate terminal of the first nMOS transistors of the pair of nMOS transistors.

5. The method of claim 2, further comprising porting the RDTMOS transistor using bulk CMOS technology.

6. The method of claim 1, wherein the semiconductor memory component comprises an ADTMOS transistor.

7. The method of claim 6, wherein the tying at least a first pre-designated body terminal of at least one transistor selected from the group consisting essentially of a pair of pMOS transistors and a pair of nMOS transistors to at least a second pre-designated terminal of a pre-designated transistor selected from the group consisting essentially of the pair of pMOS transistors and the pair of nMOS transistors comprises:
    tying a second pMOS body terminal of the second pMOS transistor of the pair of pMOS transistors to a second pMOS gate terminal of the second pMOS transistor of the pair of pMOS transistor;
    tying a first nMOS body terminal of a first nMOS transistor of the pair of nMOS transistors to a second nMOS gate terminal of a second nMOS transistor of the pair of nMOS transistors; and
    tying a second nMOS body terminal of the second nMOS transistor of the pair of nMOS transistors to the second gate nMOS gate terminal of the second nMOS transistor of the pair of nMOS transistors.

8. The method of claim 6, further comprising porting the ADTMOS transistor using deep nWell technology.

9. An apparatus comprising:
    a semiconductor memory component comprising:
        a pair of pMOS transistors comprising:
            a first pMOS transistor comprising:
                a first pMOS body terminal; and
                a first pMOS gate terminal; and
            a second pMOS transistor comprising:
                a second pMOS body terminal; and
                a second pMOS gate terminal tied to the first pMOS body terminal of the first pMOS transistor; and
        a pair of nMOS transistors comprising:
            a first nMOS transistor comprising:
                a first nMOS body terminal; and
                a first nMOS gate terminal; and
            a second nMOS transistor comprising:
                a second nMOS body terminal; and
                a second nMOS gate terminal,
        wherein at least a first pre-designated body terminal of at least one transistor selected from the group consisting essentially of the pair of pMOS transistors and the pair of nMOS transistors is tied to at least a second pre-designated terminal of at least one pre-designated transistor selected from the group consisting essentially of the pair of pMOS transistors and the pair of nMOS transistors.

10. The apparatus of claim 9, wherein the semiconductor memory component comprises an RDTMOS transistor.

11. The apparatus of claim 10, wherein the at least a first pre-designated body terminal of at least one transistor selected from the group consisting essentially of the pair of pMOS transistors and the pair of nMOS transistors is tied to at least a second pre-designated terminal of at least one pre-designated transistor selected from the group consisting essentially of the pair of pMOS transistors and the pair of nMOS transistors comprises:

the second pMOS body terminal of the second pMOS transistor of the pair of pMOS transistors tied to the first pMOS gate terminal of the first pMOS transistor of the pair of pMOS transistors.

12. The apparatus of claim 11, wherein the at least a first pre-designated body terminal of at least one transistor selected from the group consisting essentially of the pair of pMOS transistors and the pair of nMOS transistors is tied to at least a second pre-designated terminal of at least one pre-designated transistor selected from the group consisting essentially of the pair of pMOS transistors and the pair of nMOS transistors further comprises:

the first nMOS body terminal of the first nMOS transistor of the pair of nMOS transistors tied to the second nMOS gate terminal of the second nMOS transistor of the pair of nMOS transistors; and the second nMOS body terminal of the second nMOS transistor of the pair of nMOS transistors tied to the first nMOS gate terminal of the first nMOS transistors of the pair of nMOS transistors.

13. The apparatus of claim 11, wherein the RDTMOS transistor is ported using bulk CMOS technology.

14. The apparatus of claim 9, wherein the semiconductor memory component comprises an ADTMOS transistor.

15. The apparatus of claim 14, wherein the at least a first pre-designated body terminal of at least one transistor selected from the group consisting essentially of the pair of pMOS transistors and the pair of nMOS transistors is tied to at least a second pre-designated terminal of at least one pre-designated transistor selected from the group consisting essentially of the pair of pMOS transistors and the pair of nMOS transistors comprises:

the second pMOS body terminal of the second pMOS transistor of the pair of pMOS transistors tied to the second pMOS gate terminal of the second pMOS transistor of the pair of pMOS transistor;

the first nMOS body terminal of the first nMOS transistor of the pair of nMOS transistors tied to the second nMOS gate terminal of the second nMOS transistor of the pair of nMOS transistors; and the second nMOS body terminal of the second nMOS transistor of the pair of nMOS transistors tied to the second nMOS gate terminal of the second nMOS transistor of the pair of nMOS transistors.

16. The apparatus of claim 14, wherein the ADTMOS transistor is ported using deep nWell technology.

17. An RDTMOS transistor comprising:
a pair of pMOS transistors comprising:
   a first pMOS transistor comprising:
      a first pMOS body terminal; and
      a first pMOS gate terminal; and
   a second pMOS transistor comprising:
      a second pMOS body terminal tied to the first pMOS gate terminal of the first pMOS transistor; and
      a second pMOS gate terminal tied to the first pMOS body terminal of the first pMOS transistor; and
a pair of nMOS transistors comprising:
   a first nMOS transistor comprising:
      a first nMOS body terminal; and
      a first nMOS gate terminal; and
   a second nMOS transistor comprising:
      a second nMOS body terminal; and
      a second nMOS gate terminal.

18. The RDTMOS transistor, wherein the first nMOS body terminal of the first nMOS transistor of the pair of nMOS transistors is tied to the second nMOS gate terminal of the second nMOS transistor of the pair of nMOS transistors; and
the second nMOS body terminal of the second nMOS transistor of the pair of nMOS transistors is tied to the first nMOS gate terminal of the first nMOS transistors of the pair of nMOS transistors.

19. An ADTMOS transistor comprising:
a pair of pMOS transistors comprising:
   a first pMOS transistor comprising:
      a first pMOS body terminal; and
      a first pMOS gate terminal; and
   a second pMOS transistor comprising:
      a second pMOS body terminal; and
      a second pMOS gate terminal tied to the first pMOS body terminal of the first pMOS transistor and the second pMOS body terminal of the second pMOS transistor; and
a pair of nMOS transistors comprising:
   a first nMOS transistor comprising:
      a first nMOS body terminal; and
      a first nMOS gate terminal; and
   a second nMOS transistor comprising:
      a second nMOS body terminal tied to the second nMOS gate terminal of the second nMOS transistor; and
      a second nMOS gate terminal tied to the first nMOS body terminal of the first nMOS transistor.

* * * * *